(12) United States Patent
Yao et al.

(10) Patent No.: US 12,477,671 B2
(45) Date of Patent: Nov. 18, 2025

(54) TERMINAL

(71) Applicant: HONOR DEVICE CO., LTD., Guangdong (CN)

(72) Inventors: Wenxing Yao, Shenzhen (CN); Xuyang Wang, Shenzhen (CN); Zhenrui Tang, Shenzhen (CN); Xin Zhang, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 18/043,540

(22) PCT Filed: Apr. 20, 2022

(86) PCT No.: PCT/CN2022/087935
§ 371 (c)(1),
(2) Date: Feb. 28, 2023

(87) PCT Pub. No.: WO2023/015934
PCT Pub. Date: Feb. 16, 2023

(65) Prior Publication Data
US 2024/0407109 A1    Dec. 5, 2024

(30) Foreign Application Priority Data

Aug. 9, 2021    (CN) .......................... 202110908070.7

(51) Int. Cl.
*H05K 5/02*    (2006.01)
(52) U.S. Cl.
CPC ................................ *H05K 5/0217* (2013.01)

(58) Field of Classification Search
CPC ...................................................... H04R 1/086
See application file for complete search history.

(56) References Cited

U.S. PATENT DOCUMENTS

2015/0155614 A1    6/2015 Youn et al.
2018/0033571 A1*    2/2018 Choi ...................... G06F 1/1671
2018/0310426 A1*    10/2018 Cho ...................... H04M 1/0266
(Continued)

FOREIGN PATENT DOCUMENTS

| CN | 104506674 A | 4/2015 |
|---|---|---|
| CN | 106847588 A | 6/2017 |

(Continued)

OTHER PUBLICATIONS

Translation of CN 113096990 (Year: 2024).*
Machine translation of CN212727130U (Year: 2025).*

*Primary Examiner* — Sagar Shrestha
*Assistant Examiner* — Peter Krim
(74) *Attorney, Agent, or Firm* — Fish & Richardson P.C.

(57) ABSTRACT

This application provides a terminal. The terminal includes a battery cover, a middle frame, an adhesive component, and a waterproof component. The adhesive component is provided with an opening groove. There is an avoidance distance between the waterproof component and the opening groove, and a liquid inlet path is formed. A cross section of the waterproof component is of a convex structure or a concave structure on at least one of a first side and a second side. The first side and the second side are not on a same side as an opening of the opening groove, and are not opposite to the opening of the opening groove.

20 Claims, 17 Drawing Sheets

(56) References Cited

U.S. PATENT DOCUMENTS

| | | | |
|---|---|---|---|
| 2022/0236774 A1* | 7/2022 | Kim | H05K 5/03 |
| 2023/0052402 A1* | 2/2023 | Choi | H04R 1/086 |

FOREIGN PATENT DOCUMENTS

| | | | | |
|---|---|---|---|---|
| CN | 207117686 U | | 3/2018 | |
| CN | 207720209 U | | 8/2018 | |
| CN | 109167862 A | | 1/2019 | |
| CN | 209151206 U | | 7/2019 | |
| CN | 212727130 U | * | 3/2021 | |
| CN | 113096990 A | * | 7/2021 | ............. H01H 13/06 |
| JP | 2014068054 A | | 4/2014 | |
| JP | 2020136612 A | | 8/2020 | |
| WO | 2017065397 A1 | | 4/2017 | |

* cited by examiner

TERMINAL

CROSS-REFERENCE TO RELATED APPLICATIONS

This application is a national stage of International Application No. PCT/CN2022/087935, filed on Apr. 20, 2022, which claims priority to Chinese Patent Application No. 202110908070.7, filed on Aug. 9, 2021. The disclosures of both of the aforementioned applications are hereby incorporated by reference in their entireties.

TECHNICAL FIELD

This application relates to the field of terminal device technologies, and more specifically, to a terminal.

BACKGROUND

As a user makes a higher requirement for experience of using a terminal product, improvement of a waterproof function of the terminal product becomes a problem that needs to be urgently resolved in a process of designing a structure of the terminal product.

A mobile phone is used as an example. A battery cover and a middle frame of a mobile phone product are usually bonded by using an adhesive component. To implement a key function of the mobile phone, a support wall for placing a key FPC (Flexible Printed Circuit, flexible printed circuit) is disposed on the middle frame. There is an avoidance distance between the support wall and the adhesive component, to prevent the key FPC from being scratched by the support wall when being bent from the support wall. A waterproof component is usually disposed between the support wall and the adhesive component, and the adhesive component and the waterproof component fit with each other to form a waterproof structure.

However, to avoid a difficulty in assembling the battery cover and the middle frame caused by interference between the adhesive component and the waterproof component, there needs to be a specific avoidance distance between an opening groove of the adhesive component and the waterproof component. Avoidance space between the opening groove of the adhesive component and the waterproof component forms liquid inlet space. Each of conventional waterproof structures shown in FIG. 1 and FIG. 2 includes an adhesive component 3. The adhesive component 3 is provided with an opening groove 31, and a waterproof component 4 is placed in the opening groove 31. A gap between the adhesive component 3 and the waterproof component 4 is liquid inlet space. Liquid is likely to enter the liquid inlet space shown in FIG. 1 and FIG. 2, and there is a relatively poor waterproof effect.

SUMMARY

This application provides a terminal, to improve a waterproof effect of the terminal.

Embodiments of this application provide a terminal. The terminal includes a battery cover, a middle frame, an adhesive component, and a waterproof component. The battery cover is bonded to the middle frame by using the adhesive component. A support wall protruding in a direction of the battery cover is disposed on the middle frame. The adhesive component is provided with an opening groove, and the opening groove is a semi-closed groove. The waterproof component is disposed between the support wall and the adhesive component, and is located in the opening groove. A cross-sectional shape of the waterproof component is adapted to a cross-sectional shape of the opening groove. There is an avoidance distance between the waterproof component and the opening groove, and a liquid inlet path is formed. A cross section of the waterproof component is of a convex structure or a concave structure on at least one of a first side and a second side. The first side and the second side are not on a same side as an opening of the opening groove, and are not opposite to the opening of the opening groove.

Based on this, in a waterproof structure of the terminal in the embodiments of this application, the liquid inlet path may be extended, a liquid inlet speed may be decreased, and the concave structure or the convex structure may store liquid. Therefore, liquid may be restricted, to some extent, from entering the terminal, to improve a waterproof effect of the terminal.

In a possible implementation, the cross section of the waterproof component is of the convex structure or the concave structure on each of the first side and the second side. In this way, on each of the first side and the second side of the waterproof component, the liquid inlet path can be extended, and the liquid inlet speed can be decreased, and liquid may be stored on each of the first side and the second side. In comparison with an implementation in which there is the concave structure or the convex structure on only one side, the waterproof effect of the terminal can be further improved in this implementation.

In a possible implementation, when a side wall of at least one convex structure or concave structure on the first side of the waterproof component is in contact with a corresponding side wall of the opening groove, a side wall of at least one convex structure or concave structure on the second side of the waterproof component is in contact with the corresponding side wall of the opening groove. In this way, when a liquid inlet path on the first side is closed by using the convex structure or the concave structure on the first side of the waterproof component, a liquid inlet path on the second side is closed by using the convex structure or the concave structure on the second side of the waterproof component. Therefore, liquid can be completely restricted from entering the terminal, to further improve the waterproof effect of the terminal.

In a possible implementation, the cross section of the waterproof component is of the convex structure or the concave structure on at least one of a third side and a fourth side. The third side is on a same side as the opening of the opening groove, and the fourth side is opposite to the opening of the opening groove. In this way, the liquid inlet path may be further extended, the liquid inlet speed may be decreased, and the convex structure or the concave structure on the third side or the fourth side may store liquid, to further improve the waterproof effect of the terminal.

In a possible implementation, the cross section of the waterproof component is of the convex structure or the concave structure on each of the third side and the fourth side. The third side is on the same side as the opening of the opening groove, and the fourth side is opposite to the opening of the opening groove. In this way, in comparison with an implementation in which there is the concave structure or the convex structure on only one of the third side and the fourth side, in this implementation, the liquid inlet path may be further extended, the liquid inlet speed may be decreased, and a quantity of concave structures convex structures that can store liquid is increased, to further improve the waterproof effect of the terminal.

In a possible implementation, when a side wall of at least one convex structure or concave structure on the third side is in contact with a corresponding side wall of the opening groove, a side wall of at least one convex structure or concave structure on the fourth side is in contact with the corresponding side wall of the opening groove. In this way, when a liquid inlet path on the third side is closed by using the convex structure or the concave structure on the third side of the waterproof component, a liquid inlet path on the fourth side is closed by using the convex structure or the concave structure on the fourth side of the waterproof component. Therefore, liquid can be completely restricted from entering the terminal, to further improve the waterproof effect of the terminal.

In a possible implementation, when a central axis of the waterproof component is not parallel to a central axis of the opening groove, and a vertex of at least one convex structure or concave structure on the first side is in contact with a corresponding side wall of the opening groove, a vertex of at least one convex structure or concave structure on the second side is in contact with the corresponding side wall of the opening groove. In this way, when the waterproof component is in a state of being rotationally deviated during attachment, when a liquid inlet path on the first side is closed by using the convex structure or the concave structure on the first side, a liquid inlet path on the second side is closed by using the convex structure and the concave structure on the second side of the waterproof component. Therefore, liquid can be completely restricted from entering the terminal, to further improve the waterproof effect of the terminal.

In a possible implementation, the cross section of the waterproof component is H-shaped or cross-shaped. In this way, the liquid inlet path may be extended, the liquid inlet speed may be decreased, and liquid may be stored. Therefore, liquid is restricted, to some extent, from entering the terminal. In addition, when the waterproof component is in a state of being deviated during attachment, liquid may be completely restricted from entering the terminal. In addition, it is easier to process the H-shaped or cross-shaped waterproof component.

In a possible implementation, the waterproof component is made of a compressible waterproof material. In this way, the waterproof component can play a waterproof role, and can perform shock absorption for a part in which an electronic component is in contact with a housing of the terminal, to prevent the electronic component from being crushed.

BRIEF DESCRIPTION OF DRAWINGS

To describe the technical solutions in the embodiments of this application more clearly, the accompanying drawings that need to be used in the embodiments are briefly described below. Apparently, a person of ordinary skill in the art may further derive other drawings from these accompanying drawings without creative efforts.

DESCRIPTION OF EMBODIMENTS

The technical solutions in the embodiments of this application are clearly described below with reference to the accompanying drawings in the embodiments of this application. Obviously, the described embodiments are some but not all of the embodiments of this application. Other embodiments obtained by a person of ordinary skill in the art based on the embodiments of this application without creative efforts shall fall within the protection scope of this application.

Figure 1:
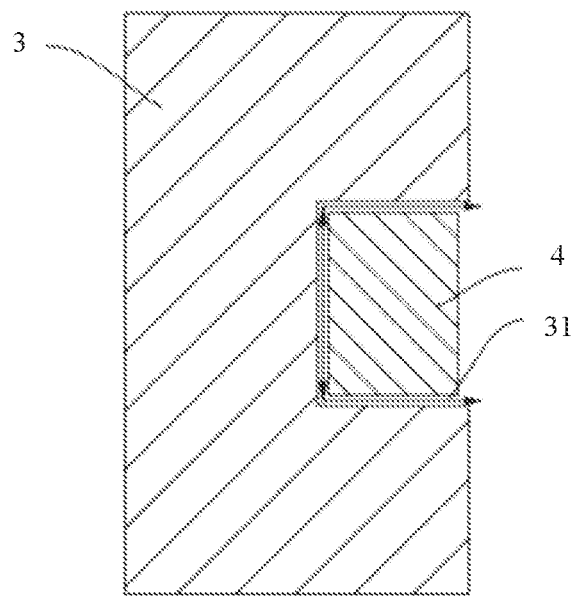
FIG. 1 is a schematic diagram of an assembly state of an adhesive component and a waterproof component in a housing structure of a current terminal.
Figure 2:
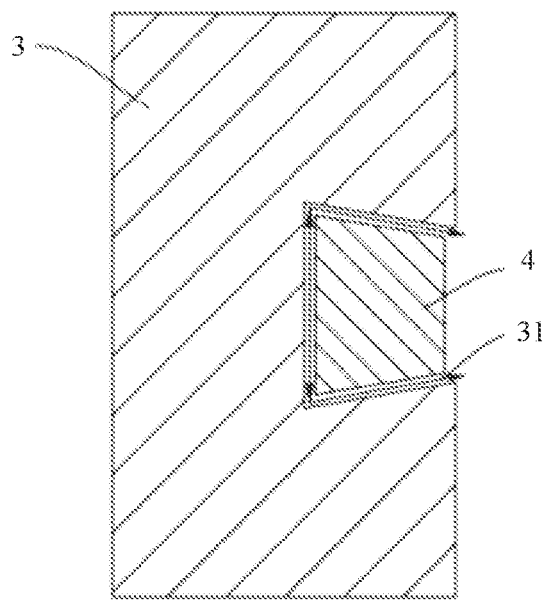
FIG. 2 is another schematic diagram of an assembly state of an adhesive component and a waterproof component in a housing structure of a current terminal.

FIG. 1 and FIG. 2 are schematic diagrams of an assembly state of an adhesive component and a waterproof component in a housing structure of a current terminal. It should be noted that in the schematic diagrams of the assembly state in FIG. 1 and FIG. 2, only the adhesive component and the waterproof component are shown, and another component is omitted. The waterproof component shown in FIG. 1 and FIG. 2 is in a basic geometric shape such as a square and a trapezoid. If this conventional adhesive component and waterproof component are used, external liquid is likely to enter the terminal, resulting in a relatively poor waterproof effect.

To resolve the problem, the embodiments of this application provide a terminal. A provided terminal device may be any terminal such as a mobile phone, a wearable device, an AR (Augmented Reality, augmented reality)/VR (Virtual Reality, virtual reality) device, a tablet computer, a notebook computer, a UMPC (Ultra-mobile Personal Computer, ultra-mobile personal computer), a netbook, or a PDA (Personal Digital Assistant, personal digital assistant). This is not limited in the embodiments of this application.

Figure 3:
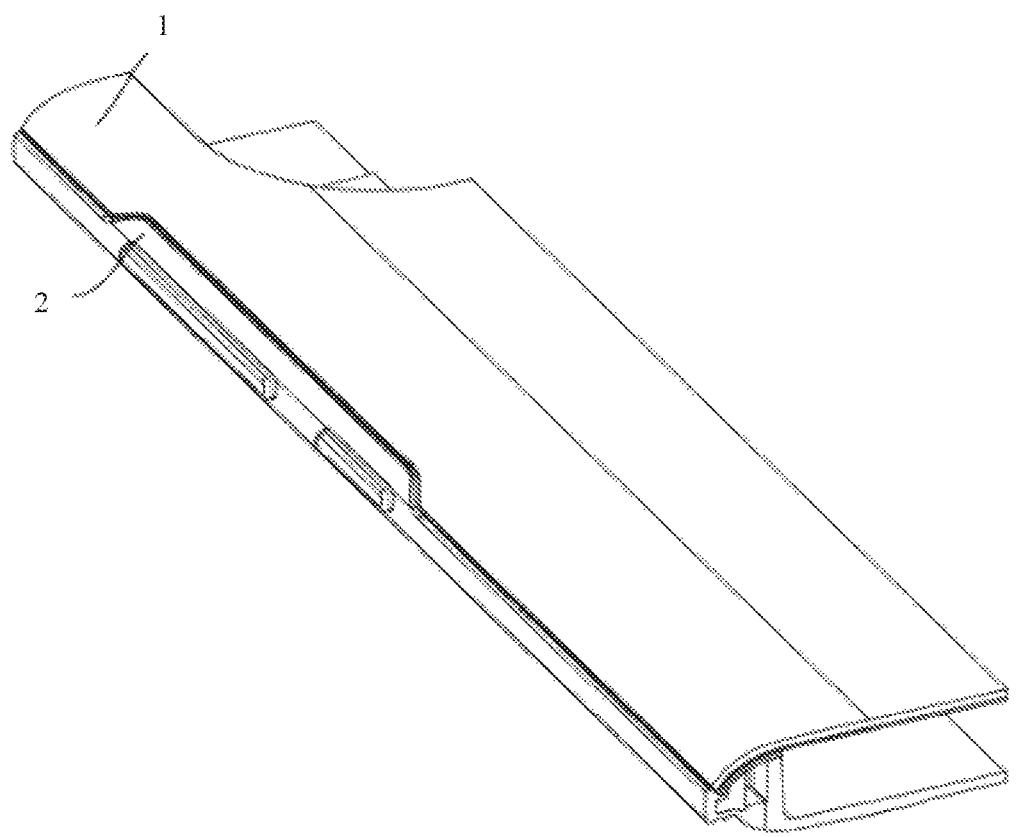
FIG. 3 is a schematic diagram of a housing structure of a terminal in a closed state according to an embodiment of this application.
Figure 4:
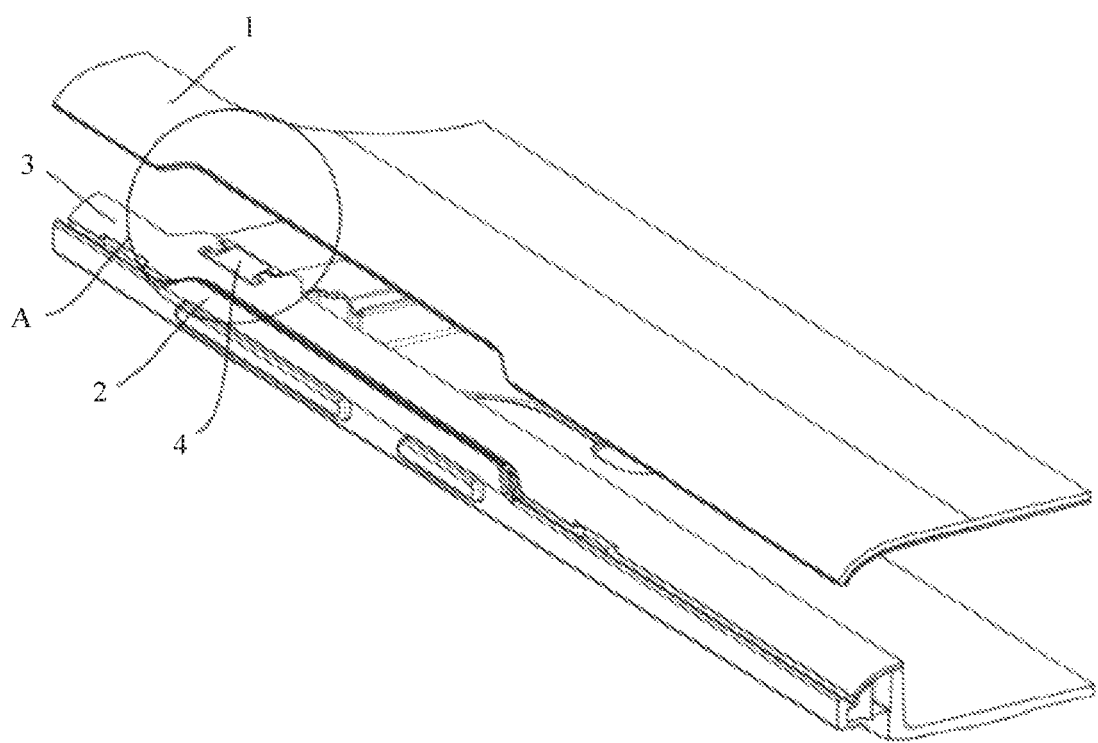
FIG. 4 is a schematic diagram of a housing structure of a terminal in an open state according to an embodiment of this application.
Figure 5:
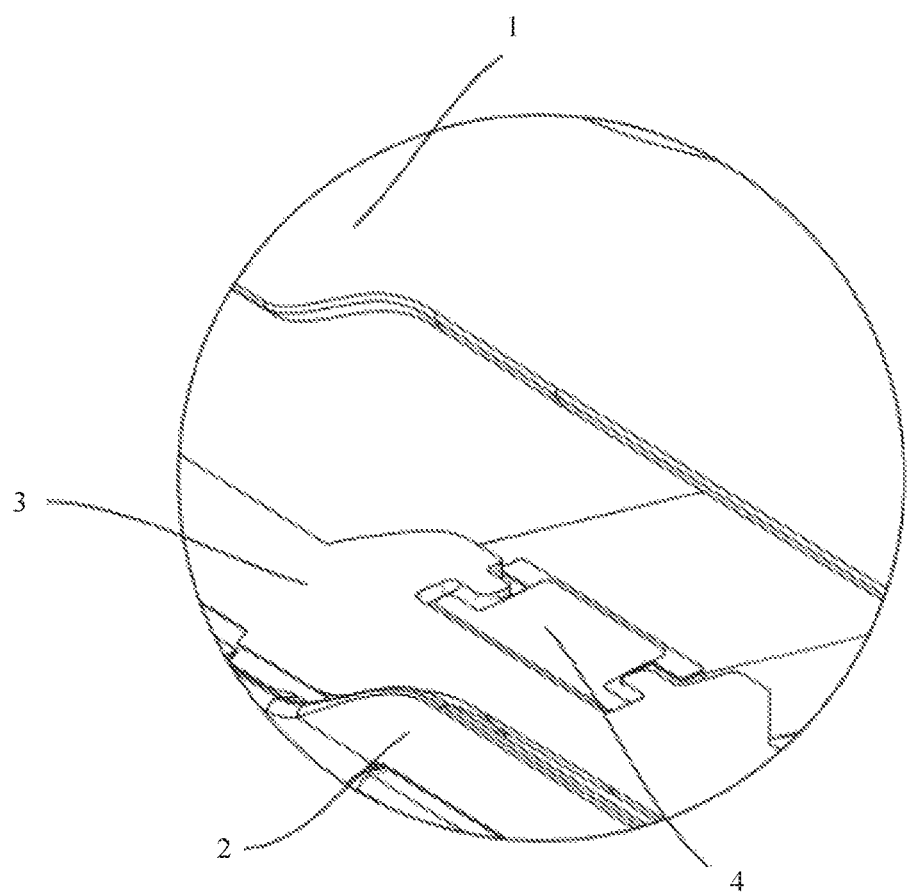
FIG. 5 is an enlarged schematic diagram of a region A in FIG. 4 according to an embodiment of this application.

FIG. 3 is a schematic diagram of a housing structure of a terminal in a closed state according to an embodiment of this application. In the embodiment shown in FIG. 3, the housing structure includes a battery cover 1 and a middle frame 2, and the battery cover 1 is connected to the middle frame 2. FIG. 4 is a schematic diagram of a housing structure in an open state according to an embodiment of this application, and FIG. 5 is an enlarged schematic diagram of a region A in FIG. 4. In the embodiments shown in FIG. 4 and FIG. 5, the housing structure includes not only all components in FIG. 1 but also an adhesive component 3. The battery cover 1 is connected to the middle frame 2 by using the adhesive component 3, for example, may be connected to the middle frame 2 by using adhesive. The battery cover 1 is connected to the middle frame 2, in other words, the housing structure is in the closed state. In the embodiments shown in FIG. 3 to FIG. 5, there is the housing structure sequentially including the battery cover 1, the adhesive component 3, and the middle frame 2 from top to bottom.

Figure 6:
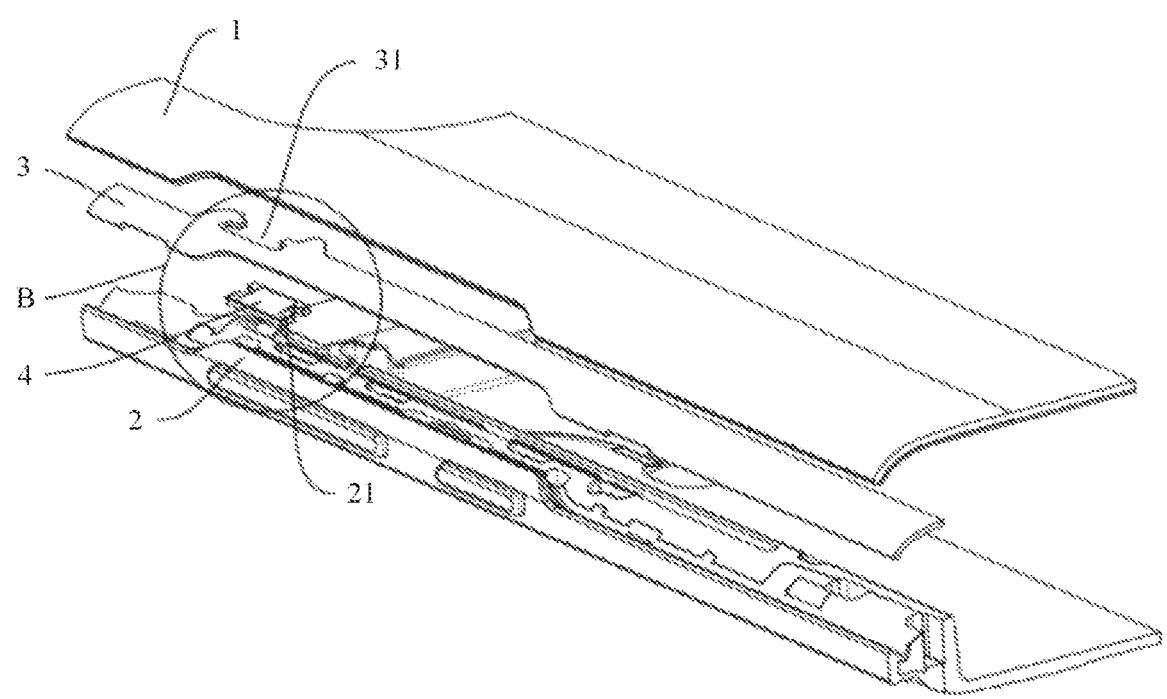
FIG. 6 is an exploded schematic diagram of a housing structure of a terminal according to an embodiment of this application.
Figure 7:
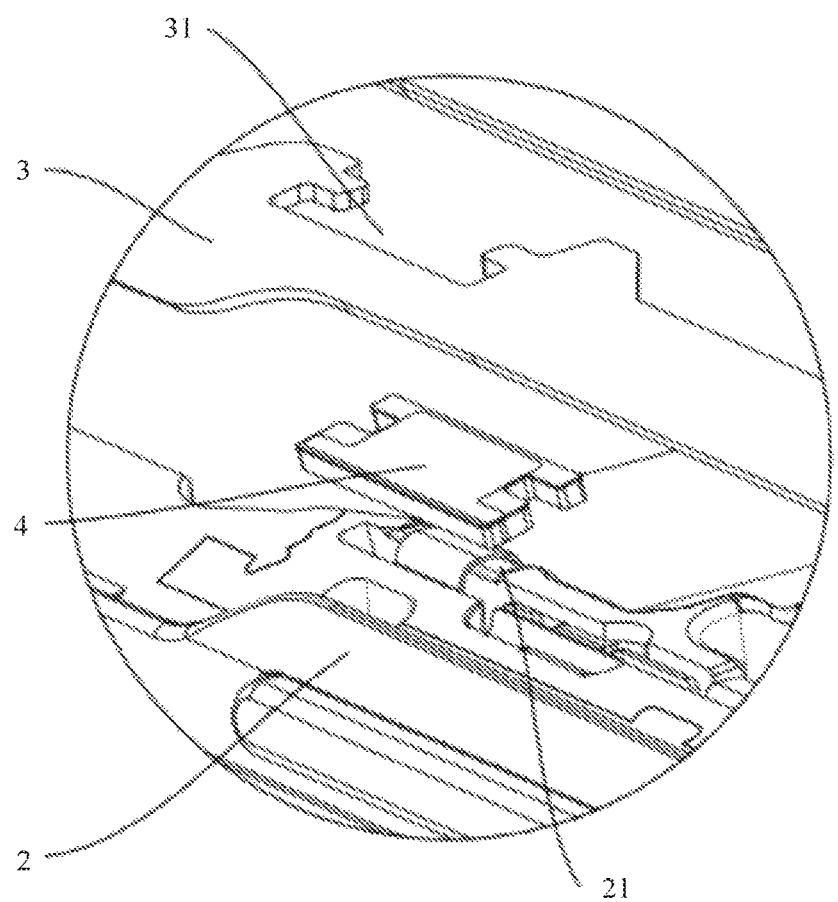
FIG. 7 is an enlarged schematic diagram of a region B in FIG. 4 according to an embodiment of this application.

FIG. 6 is an exploded schematic diagram of a terminal according to an embodiment of this application, and FIG. 7 is an enlarged schematic diagram of a region B in FIG. 6. In the embodiments shown in FIG. 6 and FIG. 7, to implement a key function of the terminal, a hole is disposed at a local position of the middle frame 2 for placing a key FPC. In addition, a support wall 21 protruding in a direction of the battery cover 1 is disposed on the middle frame 2, and the key FPC is bent from the support wall 21. Further, to avoid a case in which the key FPC is faulty because when being bent from the support wall 21, the key FPC is scratched by the support wall 21, an opening groove is disposed on a top of the support wall 21. Alternatively, a top of the support wall 21 sinks, that is, a specific avoidance distance is set between the top of the support wall 21 and the battery cover 1. Consequently, there is a gap between the top of the support wall 21 and the battery cover 1, and external water vapor is likely to enter the terminal through the gap. Therefore, a waterproof structure needs to be disposed at the gap, to improve a waterproof effect.

To ensure mounting while the waterproof effect is ensured, as shown in FIG. 4 to FIG. 7, a waterproof component 4 may be further disposed at the gap between the top of the support wall 21 and the battery cover 1. To fit with the waterproof component 4, an opening groove 31 is further disposed on the adhesive component 3. It should be noted that in each embodiment of this application, a cross-sectional shape of the opening groove 31 is adapted to a shape of the waterproof component 4. In addition, it should be noted that to avoid a difficulty in assembling the battery cover 1 and the middle frame caused by interference between the adhesive component 3 and the waterproof component 4 when the battery cover 1 and the middle frame 2 are assembled, an avoidance distance is set between the adhesive component 3 and the waterproof component 4. The adhesive component 3 and the waterproof component 4 form the waterproof structure in the embodiments of this application, and the avoidance distance between the adhesive component 3 and the waterproof component 4 forms a liquid inlet path.

In addition, it should be noted that if no avoidance distance is set between the adhesive component 3 and the waterproof component 4, the key FPC interferes with the adhesive component 3. The battery cover 1 is warped after being assembled, or the battery cover 1 is likely to come unglued after being used for a long time. In addition, the key FPC pushes up the battery cover, and for a special battery cover 1, an indentation is shown. Consequently, user experience is affected. In addition to ensuring assembly, the opening groove 31 may further prevent the adhesive component 3 from being bonded to the key FPC. When the adhesive component 3 is bonded to the key FPC, and the battery cover 1 slightly moves, the key FPC is likely to be damaged by pulling of the adhesive component 3, and consequently performance is affected.

In the embodiments of this application, technical solutions that may improve the waterproof effect of the terminal are described below in detail by using the waterproof structure in the terminal in the foregoing embodiments as an example.

A first embodiment of this application is described below.

Figure 8:
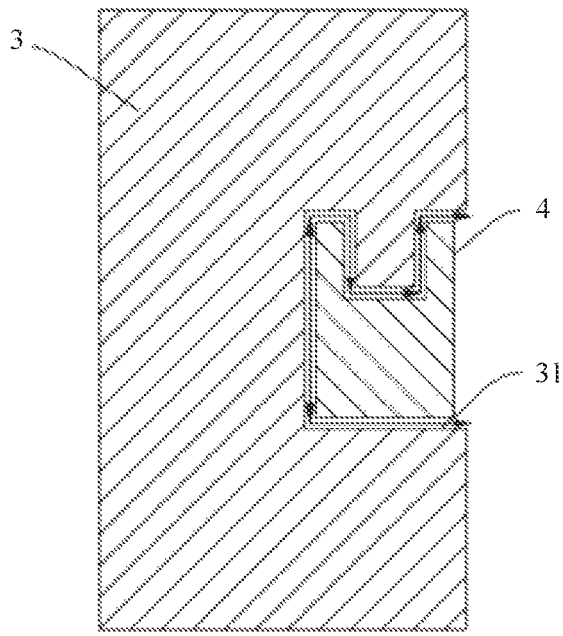
FIG. 8 is a schematic diagram of an assembly state of an adhesive component and a waterproof component in a housing structure of a terminal according to a first embodiment of this application.

FIG. 8 is a schematic diagram of an assembly state of an adhesive component 3 and a waterproof component 4 according to the first embodiment of this application. It should be noted that in FIG. 8, only the adhesive component 3 and the waterproof component 4 are shown, and another component is omitted. In the embodiment shown in FIG. 8, there is a concave structure on a first side or a second side of a cross section of the waterproof component 4. In the embodiment shown in FIG. 8, the first side and the second side of the cross section of the waterproof component 4 are not on a same side as an opening of an opening groove 31, and are not opposite to the opening of the opening groove 31.

In the embodiment shown in FIG. 8, the waterproof component 4 and the adhesive component 3 are normally mounted. After entering a waterproof structure from the outside, liquid flows along a gap between the waterproof component 4 and the adhesive component 3. In this case, all gaps between the waterproof component 4 and the adhesive component 3 communicate with each other. There is the concave structure on the first side or the second side, and therefore in comparison with a conventional waterproof structure (as shown in FIG. 1 and FIG. 2), a liquid inlet path in FIG. 8 is longer than that of the conventional waterproof structure. In addition, the concave structure on the first side or the second side in FIG. 8 may further store the liquid.

The technical solutions provided in the first embodiment of this application have the following beneficial effects:

When the waterproof component 4 and the adhesive component 3 are normally mounted, after entering the waterproof structure from the outside, the liquid enters from an inlet of a liquid inlet path on the first side or the second side, then passes through the concave structure on the first side or the second side, and finally flows out from an outlet. Therefore, the added concave structure can significantly extend the liquid inlet path, to decrease a liquid inlet speed. In addition, after entering the concave structure along the liquid inlet path, the liquid is stored in the concave structure. Therefore, the liquid can be restricted, to some extent, from entering a terminal. Similarly, if there is a convex structure on the first side or the second side of the waterproof component 4, the liquid inlet path can also be extended, the liquid inlet speed can be decreased, and liquid can be stored. Therefore, the liquid is restricted, to some extent, from entering the terminal. Finally, in comparison with the conventional waterproof structure, a waterproof effect is improved.

A second embodiment of this application is described below.

FIG. 9a to FIG. 9e are schematic diagrams of an assembly state of an adhesive component 3 and a waterproof component 4 according to the second embodiment of this application. It should be noted that in FIG. 9a to FIG. 9e, only the adhesive component 3 and the waterproof component 4 are shown, and another component is omitted. In the embodiment shown in FIG. 9a to FIG. 9e, there is a concave structure on each of a first side and a second side of a cross section of the waterproof component 4. In the embodiment shown in FIG. 9a to FIG. 9e, the first side and the second side of the cross section of the waterproof component 4 are not on a same side as an opening of an opening groove 31, and are not opposite to the opening of the opening groove 31. Therefore, actually, in the embodiment shown in FIG. 9a to FIG. 9e, the cross section of the waterproof component 4 is H-shaped.

Figure 9A:
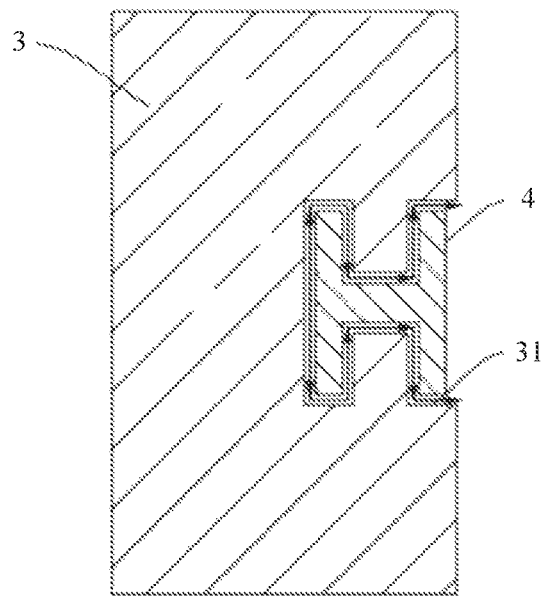
FIG. 9a to FIG. 9e are schematic diagrams of an assembly state of an adhesive component and a waterproof component in a housing structure of a terminal according to a second embodiment of this application.

FIG. 9a is a schematic diagram of a state in which the waterproof component 4 whose cross section is H-shaped and the adhesive component 3 are normally mounted, in other words, the waterproof component 4 and the adhesive component 3 are not deviated during mounting. As shown in FIG. 9a, after entering a waterproof structure from the outside, liquid flows along a gap between the waterproof component 4 and the opening groove 31. In this case, all gaps between the waterproof component 4 and the opening groove 31 communicate with each other. There is the concave structure on each of the first side and the second side, and therefore in comparison with a conventional waterproof structure (as shown in FIG. 1 and FIG. 2), a liquid inlet path in FIG. 9a is longer than that of the conventional waterproof structure. In addition, the concave structure on each of the first side and the second side in FIG. 9a may further store the liquid.

Figure 9B:
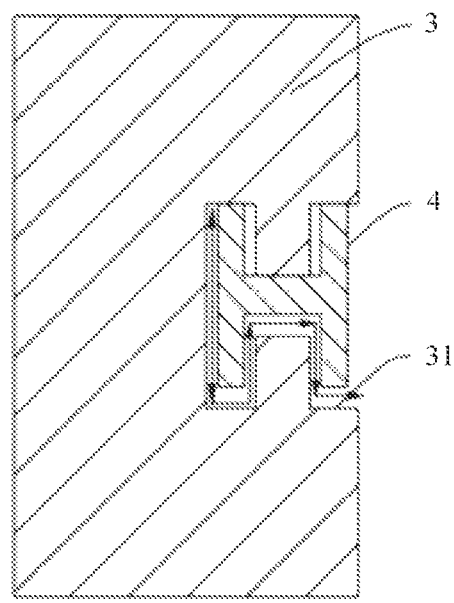

FIG. 9b is a schematic diagram of a state in which the waterproof component 4 whose cross section is H-shaped is deviated upward during attachment. As shown in FIG. 9b, after liquid enters a waterproof structure from the outside, the liquid can flow only along a bottom gap between the waterproof component 4 and the opening groove 31 because a top gap between the waterproof component 4 and the opening groove 31 is closed. However, there is the concave structure on each of the first side and the second side, and therefore in comparison with a conventional waterproof structure, a liquid inlet path in FIG. 9b is still longer than that of the conventional waterproof structure, and a concave structure at a bottom may still store the liquid.

Figure 9C:
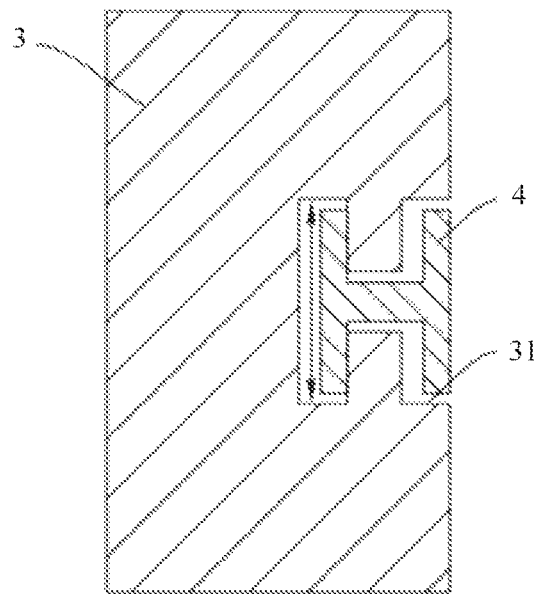

FIG. 9c is a schematic diagram of a state in which the waterproof component 4 whose cross section is H-shaped is deviated to the right during attachment. As shown in FIG. 9c, after liquid enters a waterproof structure from the outside, a liquid inlet path on the first side is closed because a side wall of the concave structure on the first side is in contact with a side wall of the opening groove 31. In addition, a side wall of the concave structure on the second side is in contact with the side wall of the opening groove 31, and therefore a liquid inlet path on the second side is closed. After the liquid inlet path on each of the first side and the second side is closed, the liquid can no longer flow along a gap between the waterproof component 4 and the opening groove 31. Therefore, in the embodiment shown in FIG. 9c, when the waterproof component 4 is deviated to the right during attachment, the liquid can be completely restricted from entering a terminal.

Figure 9D:
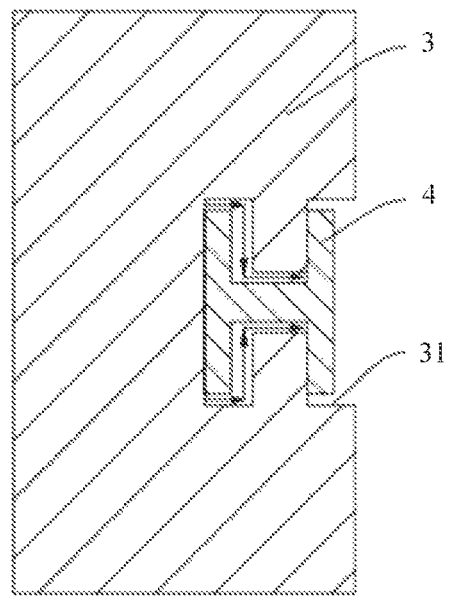

FIG. 9d is a schematic diagram of a state in which the waterproof component 4 whose cross section is H-shaped is deviated to the left during attachment. As shown in FIG. 9d, after liquid enters a waterproof structure from the outside, a liquid inlet path on the first side is closed because a side wall of the concave structure on the first side is in contact with a side wall of the opening groove 31. In addition, a side wall of the concave structure on the second side is in contact with the side wall of the opening groove 31, and therefore a liquid inlet path on the second side is closed. After the liquid inlet path on each of the first side and the second side is closed, the liquid can flow a specific distance along a gap between the waterproof component 4 and the opening groove 31, but still cannot flow into a terminal. Therefore, in the embodiment shown in FIG. 9d, when the waterproof component 4 is deviated to the left during attachment, the liquid can also be completely restricted from entering the terminal.

Figure 9E:
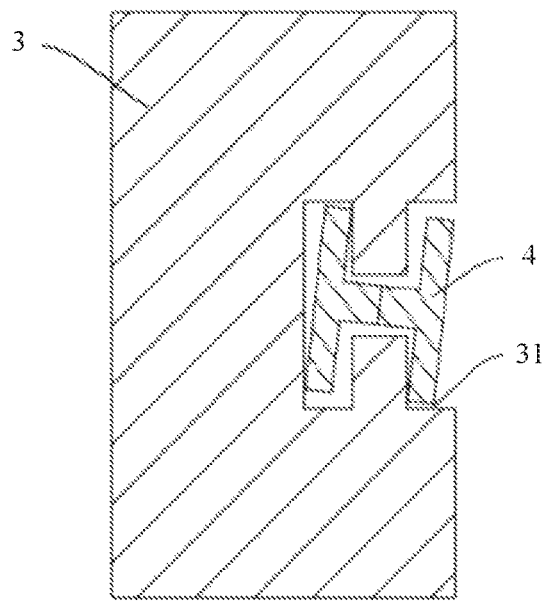

FIG. 9e is a schematic diagram of a state in which the waterproof component 4 whose cross section is H-shaped is rotationally deviated during attachment. As shown in FIG. 9e, after liquid enters a waterproof structure from the outside, a liquid inlet path on the first side is closed because a vertex of a side wall of the concave structure on the first side is in contact with a side wall of the opening groove 31. In addition, a vertex of a side wall of the concave structure on the second side is in contact with the side wall of the opening groove 31, and therefore a liquid inlet path on the second side is closed. After the liquid inlet path on each of the first side and the second side is closed, the liquid can flow a specific distance along a gap between the waterproof component 4 and the opening groove 31, but still cannot flow into a terminal. Therefore, in the embodiment shown in FIG. 9e, when the waterproof component 4 is rotationally deviated during attachment, the liquid can also be completely restricted from entering the terminal.

The technical solutions provided in the second embodiment of this application have the following beneficial effects:

First, if the waterproof component 4 and the opening groove 31 are in the state of being normally mounted, after entering the waterproof structure from the outside, the liquid enters from an inlet of the liquid inlet path on the first side, then passes through the concave structure on the first side, and finally flows out from an outlet. Therefore, the added concave structure can significantly extend the liquid inlet path, to decrease a liquid inlet speed. Similarly, the liquid further enters from an inlet of the liquid inlet path on the second side, then passes through the concave structure on the second side, and finally flows out from an outlet. Therefore, the added concave structure can also significantly extend the liquid inlet path, to decrease the liquid inlet speed. In this way, a waterproof effect of the terminal is improved in terms of decreasing the liquid inlet speed. In addition, after entering the concave structure on each of the first side and the second side along the liquid inlet path, the liquid is stored in the concave structure, and therefore the liquid can be restricted, to some extent, from entering the terminal. The waterproof effect of the terminal is improved in terms of liquid storage.

If the waterproof component 4 is in the state of being deviated upward or downward during attachment, when a liquid inlet path on one side is closed, the added concave structure can still extend a liquid inlet path on the other side, and overall the liquid inlet speed can still be decreased. If the waterproof component 4 is in the state of being deviated to the left or to the right during attachment, the liquid inlet path on each of the first side and the second side can be completely closed, and therefore the liquid can be completely restricted from entering the terminal. If the waterproof component 4 is rotationally deviated during attachment, the liquid inlet path on each of the first side and the second side is also closed, and therefore the liquid can also be completely restricted from entering the terminal.

Therefore, in the technical solutions provided in the second embodiment of this application, when the waterproof component 4 and the adhesive component 3 are in the state of being normally mounted, the state of being deviated upward during attachment, and the state of being deviated downward during attachment, the waterproof effect of the terminal can be improved in terms of decreasing the liquid inlet speed and liquid storage. In addition, when the waterproof component 4 is in the state of being deviated to the left during attachment, the state of being deviated to the right during attachment, and the state of being rotationally deviated during attachment, the liquid can be completely restricted from entering the terminal. In this way, regardless of a mounting state of the waterproof component 4 and the adhesive component 3, the waterproof effect of the terminal can be improved.

A third embodiment of this application is described below.

FIG. 10*a* to FIG. 10*e* are schematic diagrams of an assembly state of an adhesive component 3 and a waterproof component 4 according to the third embodiment of this application. It should be noted that in FIG. 10*a* to FIG. 10*e*, only the adhesive component 3 and the waterproof component 4 are shown, and another component is omitted. In the embodiment shown in FIG. 10*a* to FIG. 10*e*, there is a convex structure on each of a first side and a second side of a cross section of the waterproof component 4. In the embodiment shown in FIG. 10*a* to FIG. 10*e*, the first side and the second side of the cross section of the waterproof component 4 are not on a same side as an opening of an opening groove 31, and are not opposite to the opening of the opening groove 31. Therefore, actually, in the embodiment shown in FIG. 10*a* to FIG. 10*e*, the cross section of the waterproof component 4 is cross-shaped.

Figure 10A:
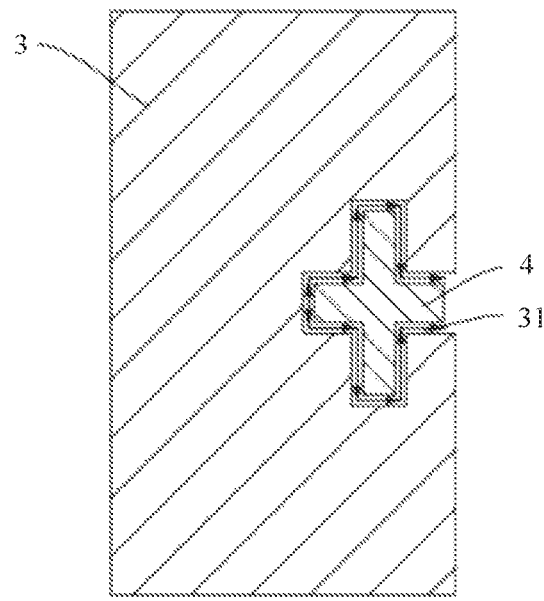
FIG. 10a to FIG. 10e are schematic diagrams of an assembly state of an adhesive component and a waterproof component in a housing structure of a terminal according to a third embodiment of this application.

FIG. 10*a* is a schematic diagram of a state in which the waterproof component 4 whose cross section is cross-shaped and the adhesive component 3 are normally mounted, in other words, the waterproof component 4 and the adhesive component 3 are not deviated during mounting. As shown in FIG. 10*a*, after entering a waterproof structure from the outside, liquid flows along a gap between the waterproof component 4 and the opening groove 31. In this case, all gaps between the waterproof component 4 and the opening groove 31 communicate with each other. There is the convex structure on each of the first side and the second side, and therefore in comparison with a conventional waterproof structure (as shown in FIG. 1 and FIG. 2), a liquid inlet path in FIG. 10*a* is longer than that of the conventional waterproof structure. In addition, the convex structure on each of the first side and the second side in FIG. 10*a* may further store the liquid.

Figure 10B:
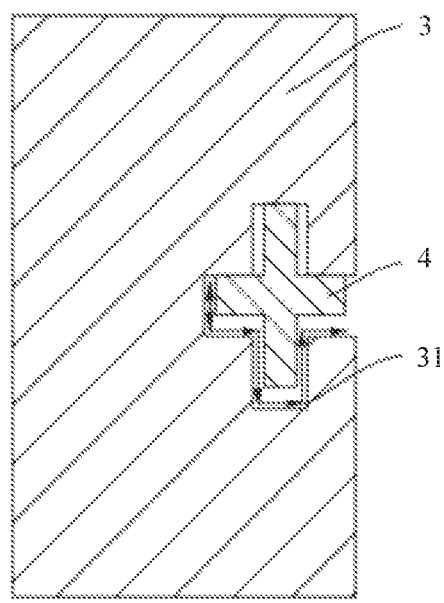

FIG. 10*b* is a schematic diagram of a state in which the waterproof component 4 whose cross section is cross-shaped is deviated upward during attachment. As shown in FIG. 10*b*, after liquid enters a waterproof structure from the outside, the liquid can flow only along a bottom gap between the waterproof component 4 and the opening groove 31 because a top gap between the waterproof component 4 and the opening groove 31 is closed. However, there is the convex structure on each of the first side and the second side, and therefore in comparison with a conventional waterproof structure, a liquid inlet path in FIG. 10*b* is still longer than that of the conventional waterproof structure, and a convex structure at a bottom may still store the liquid.

Figure 10C:
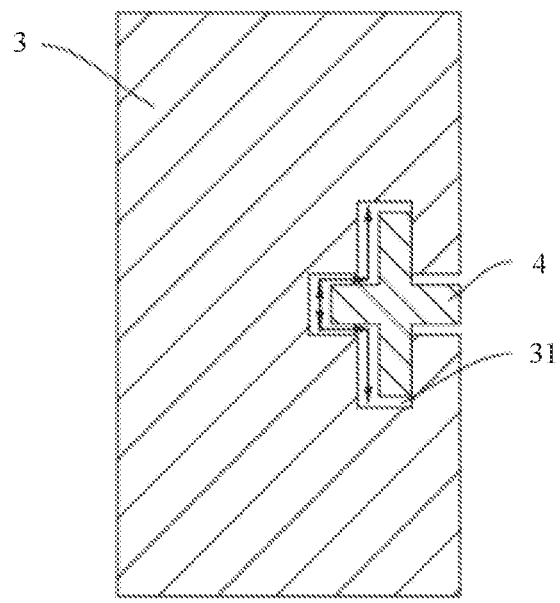

FIG. 10*c* is a schematic diagram of a state in which the waterproof component 4 whose cross section is cross-shaped is deviated to the right during attachment. As shown in FIG. 10*c*, after liquid enters a waterproof structure from the outside, a liquid inlet path on the first side is closed because a side wall of the convex structure on the first side is in contact with a side wall of the opening groove 31. In addition, a side wall of the convex structure on the second side is in contact with the side wall of the opening groove 31, and therefore a liquid inlet path on the second side is closed. After the liquid inlet path on each of the first side and the second side is closed, the liquid can no longer flow along a gap between the waterproof component 4 and the opening groove 31. Therefore, in the embodiment shown in FIG. 10*c*, when the waterproof component 4 is deviated to the right during attachment, the liquid can be completely restricted from entering a terminal.

Figure 10D:
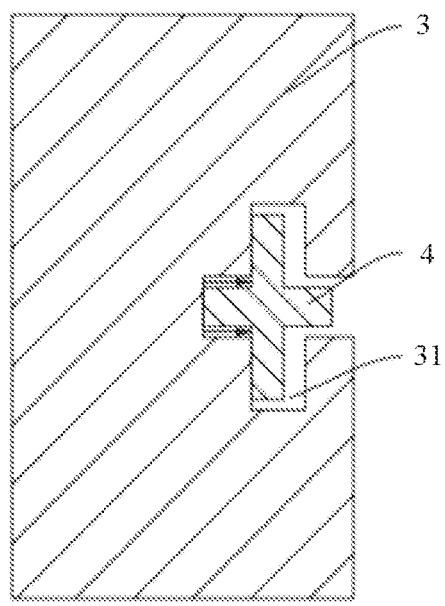

FIG. 10*d* is a schematic diagram of a state in which the waterproof component 4 whose cross section is cross-shaped is deviated to the left during attachment. As shown in FIG. 10*d*, after liquid enters a waterproof structure from the outside, a liquid inlet path on the first side is closed because a side wall of the convex structure on the first side is in contact with a side wall of the opening groove 31. In addition, a side wall of the convex structure on the second side is in contact with the side wall of the opening groove 31, and therefore a liquid inlet path on the second side is closed. After the liquid inlet path on each of the first side and the second side is closed, the liquid can flow a specific distance along a gap between the waterproof component 4 and the opening groove 31, but still cannot flow into a terminal. Therefore, in the embodiment shown in FIG. 10*d*, when the waterproof component 4 is deviated to the left during attachment, the liquid can also be completely restricted from entering the terminal.

Figure 10E:
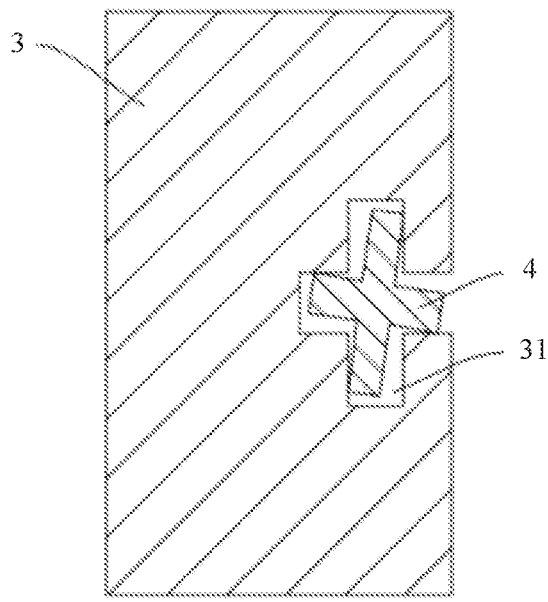

FIG. 10*e* is a schematic diagram of a state in which the waterproof component 4 whose cross section is cross-shaped is rotationally deviated during attachment. As shown in FIG. 10*e*, after liquid enters a waterproof structure from the outside, a liquid inlet path on the first side is closed because a vertex of a side wall of the convex structure on the first side is in contact with a side wall of the opening groove 31. In addition, a vertex of a side wall of the convex structure on the second side is in contact with the side wall of the opening groove 31, and therefore a liquid inlet path on the second side is closed. After the liquid inlet path on each of the first side and the second side is closed, the liquid can flow a specific distance along a gap between the waterproof component 4 and the opening groove 31, but still cannot flow into a terminal. Therefore, in the embodiment shown in FIG. 10*e*, when the waterproof component 4 is rotationally deviated during attachment, the liquid can also be completely restricted from entering the terminal.

The technical solutions provided in the third embodiment of this application have the following beneficial effects:

First, if the waterproof component 4 and the opening groove 31 are in the state of being normally mounted, after entering the waterproof structure from the outside, the liquid enters from an inlet of the liquid inlet path on the first side, then passes through the convex structure on the first side, and finally flows out from an outlet. Therefore, the added convex structure can significantly extend the liquid inlet path, to decrease a liquid inlet speed. Similarly, the liquid further enters from an inlet of the liquid inlet path on the second side, then passes through the convex structure on the second side, and finally flows out from an outlet. Therefore, the added convex structure can also significantly extend the liquid inlet path, to decrease the liquid inlet speed. In this way, a waterproof effect of the terminal is improved in terms of decreasing the liquid inlet speed. In addition, after entering the convex structure on each of the first side and the second side along the liquid inlet path, the liquid is stored in the convex structure, and therefore the liquid can be restricted, to some extent, from entering the terminal. The waterproof effect of the terminal is improved in terms of liquid storage.

If the waterproof component 4 is in the state of being deviated upward or downward during attachment, when a liquid inlet path on one side is closed, the added convex structure can still extend a liquid inlet path on the other side, and overall the liquid inlet speed can still be decreased.

If the waterproof component 4 is in the state of being deviated to the left or to the right during attachment, the liquid inlet path on each of the first side and the second side can be completely closed, and therefore the liquid can be completely restricted from entering the terminal.

If the waterproof component 4 is rotationally deviated during attachment, the liquid inlet path on each of the first side and the second side is also closed, and therefore the liquid can also be completely restricted from entering the terminal.

Therefore, in the technical solutions provided in the third embodiment of this application, when the waterproof component 4 and the opening groove 31 are in the state of being normally mounted, the state of being deviated upward during attachment, and the state of being deviated downward during attachment, the waterproof effect of the terminal can be improved in terms of decreasing the liquid inlet speed and liquid storage. In addition, when the waterproof component 4 is in the state of being deviated to the left during attachment, the state of being deviated to the right during attachment, and the state of being rotationally deviated during attachment, the liquid can be completely restricted from entering the terminal. In this way, regardless of a mounting state of the waterproof component 4 and the adhesive component 3, the waterproof effect of the terminal can be improved.

FIG. 11a to FIG. 11e are schematic diagrams of an assembly state of an adhesive component and a waterproof component in a housing structure of a terminal according to a fourth embodiment of this application. In the embodiment shown in FIG. 11a to FIG. 11e, there is a concave structure and a convex structure on each of a first side and a second side of a cross section of the waterproof component 4.

Figure 11A:
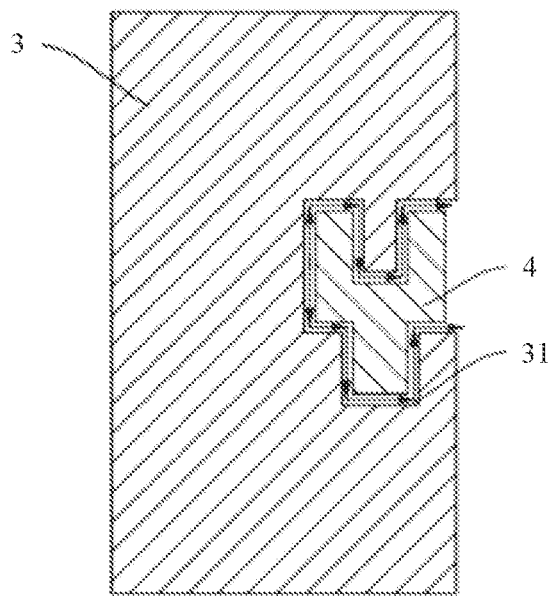
FIG. 11a to FIG. 11e are schematic diagrams of an assembly state of an adhesive component and a waterproof component in a housing structure of a terminal according to a fourth embodiment of this application.

FIG. 11a is a schematic diagram of a state in which the waterproof component 4 and the adhesive component 3 are normally mounted. If the waterproof component 4 and the adhesive component 3 are in a state of being normally mounted, the concave structure and the convex structure extend a liquid inlet path, to decrease a liquid inlet speed. In addition, the concave structure and the convex structure can store liquid, and therefore the liquid is restricted, to some extent, from continuing to enter the terminal. A specific implementation principle is consistent with those in the second embodiment and the third embodiment. Details are not described in this embodiment.

Figure 11B:
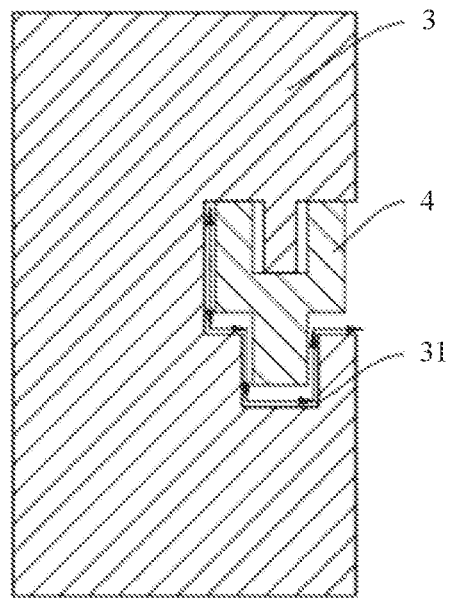

FIG. 11b is a schematic diagram of a mounting state in which the waterproof component 4 is deviated upward during attachment. If the waterproof component 4 is in a mounting state of being deviated upward or downward during attachment, the concave structure and the convex structure extend a liquid inlet path, to decrease a liquid inlet speed. In addition, the concave structure and the convex structure can store liquid, and therefore the liquid is restricted, to some extent, from continuing to enter the terminal. A specific implementation principle is consistent with those in the second embodiment and the third embodiment. Details are not described in this embodiment.

Figure 11C:
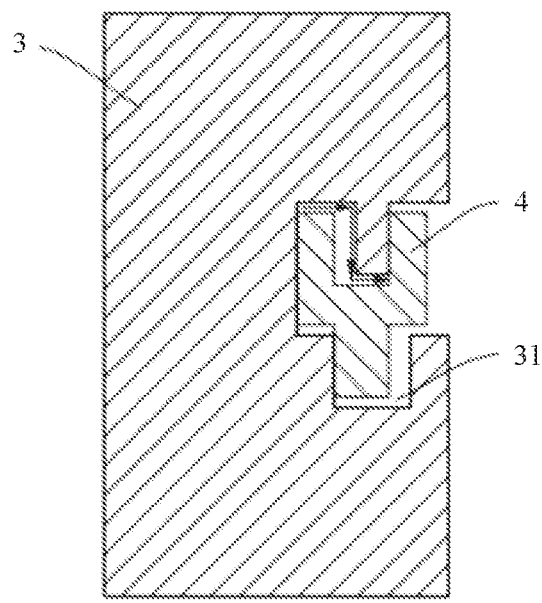
Figure 11D:
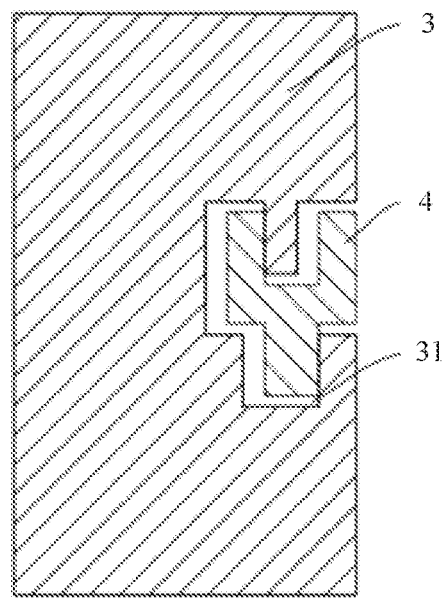
Figure 11E:
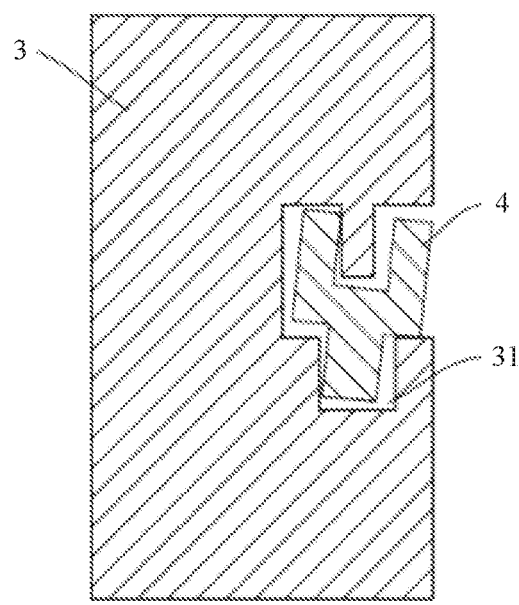

FIG. 11c is a schematic diagram of a mounting state in which the waterproof component 4 is deviated to the left during attachment, FIG. 11d is a schematic diagram of a mounting state in which the waterproof component 4 is deviated to the right during attachment, and FIG. 11e is a schematic diagram of a mounting state in which the waterproof component 4 is rotationally deviated during attachment. If the waterproof component 4 is in one of the mounting state of being deviated to the left during attachment, the mounting state of being deviated to the right during attachment, and the mounting state of being rotationally deviated during attachment, liquid can be completely restricted from entering the terminal. A specific implementation principle is consistent with those in the second embodiment and the third embodiment. Details are not described in this embodiment.

Figure 12:
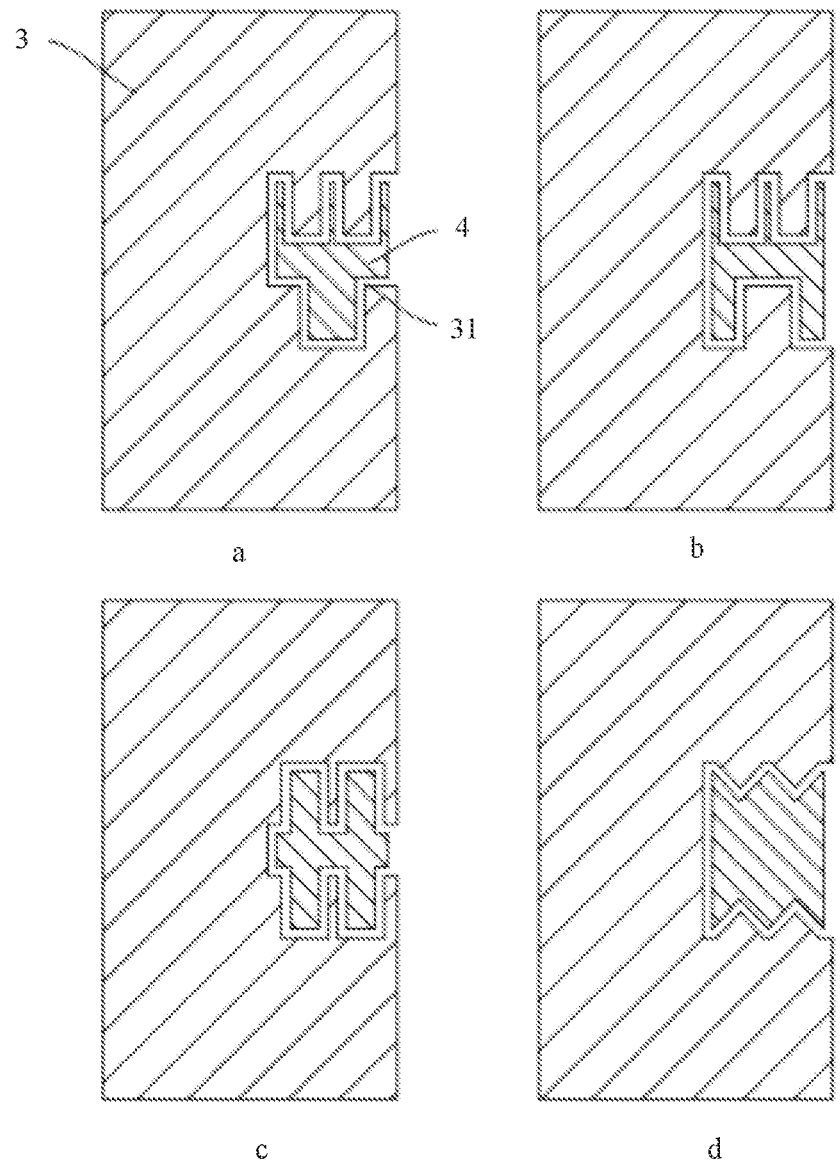
FIG. 12 is a schematic diagram of an assembly state of an adhesive component and a waterproof component in a housing structure of a terminal according to a fifth embodiment to an eighth embodiment of this application.

FIG. 12 is a schematic diagram of an assembly state of an adhesive component and a waterproof component in a housing structure of a terminal according to a fifth embodiment to an eighth embodiment of this application. In the fifth embodiment shown in (a) in FIG. 12, there are two concave structures on a first side of a cross section of the waterproof component 4, and there is one convex structure on a second side In a sixth embodiment shown in (b) in FIG. 12, there are two concave structures on a first side of a cross section of the waterproof component 4, and there is one convex structure on a second side In a seventh embodiment shown in (c) in FIG. 12, there are two convex structures on a first side of a cross section of the waterproof component 4, and there are also two convex structures on a second side. In the eighth embodiment shown in (d) in FIG. 12, there are two concave structures on a first side of a cross section of the waterproof component 4, and there are also two convex structures on a second side. Beneficial effects in the first embodiment to the fourth embodiment can also be achieved in the several modified embodiments shown in FIG. 12. Therefore, if the cross section of the waterproof component 4 is of the convex structure or the concave structure on each of the first side and the second side, regardless of a mounting state of the waterproof component 4 and the adhesive component 3, a waterproof effect of the terminal can be improved.

It should be noted that if the waterproof component 4 and the adhesive component 3 are in a state of being normally mounted, a width of a liquid inlet path between the waterproof component 4 and an opening groove 31 always remains unchanged, in other words, a width of a gap between the waterproof component 4 and the opening groove 31 always remains unchanged. In this way, during mounting, regardless of whether the waterproof component 4 is deviated to the left or to the right during attachment, it can be ensured that a liquid inlet path on each of the first side and the second side is closed, to ensure that liquid is completely restricted from entering the terminal.

In addition, it should be noted that although the liquid inlet path may be completely closed when the waterproof component in the current terminal shown in FIG. 1 and FIG. 2 is rotationally deviated during attachment and even the liquid inlet path is completely closed when the trapezoidal waterproof component shown in FIG. 2 is deviated to the right during attachment, it may be learned that in comparison with this embodiment of this application, it is more difficult to completely close the liquid inlet path by using the waterproof component in the current terminal. For example, the trapezoidal waterproof component in FIG. 2 needs to be deviated to the right for a relatively long distance during attachment, to completely close the liquid inlet path. Therefore, in an actual mounting process, if the technical solutions in this embodiment of this application are used, the liquid inlet path can be extended, a liquid inlet speed can be decreased, and liquid can be stored. In addition, there is a higher probability of completely closing the liquid inlet path. Therefore, there is a higher probability of completely restricting the liquid from entering the terminal.

A ninth embodiment of this application is described below.

Figure 13:
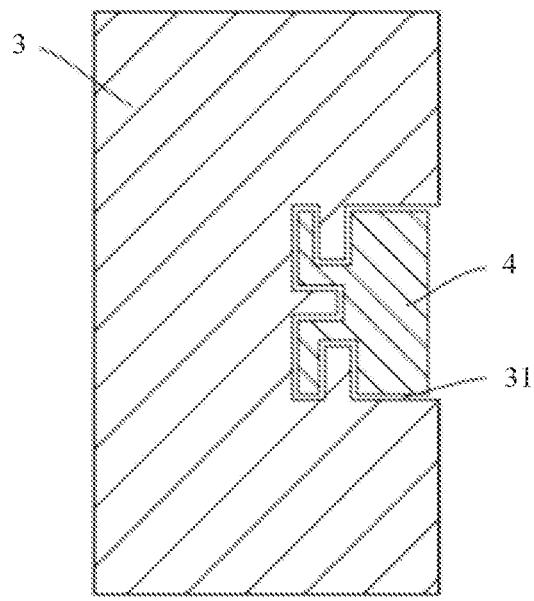
FIG. 13 is a schematic diagram of an assembly state of an adhesive component and a waterproof component in a housing structure of a terminal according to a ninth embodiment of this application.

FIG. 13 is a schematic diagram of an assembly state of an adhesive component 3 and a waterproof component 4 according to an eighth embodiment of this application. It should be noted that in FIG. 13, only the adhesive component 3 and the waterproof component 4 are shown, and another component is omitted. In the embodiment shown in FIG. 13, there is a concave structure on each of a first side and a second side of a cross section of the waterproof component 4. In addition, there is also a concave structure on a third side of the cross section of the waterproof component 4. The third side shown in FIG. 13 is opposite to an opening of an opening groove 31. In the embodiment shown in FIG. 13, the waterproof component 4 and the adhesive component 3 are in a state of being normally mounted. After liquid enters a waterproof structure from the outside, a liquid inlet speed is decreased before the liquid enters a liquid inlet path on the first side and a liquid inlet path on the second side. This is because a liquid inlet path on the third side is longer than that on a third side of a conventional waterproof structure. In addition, the liquid inlet path on the third side may store the liquid. Therefore, the liquid may be restricted, to some extent, from entering the liquid inlet path on the first side and the liquid inlet path on the second side. Therefore, in comparison with the second embodiment to the eighth embodiment, in the ninth embodiment of this application, there is a better effect in restricting the liquid from entering the terminal.

A tenth embodiment of this application is described below.

Figure 14A:
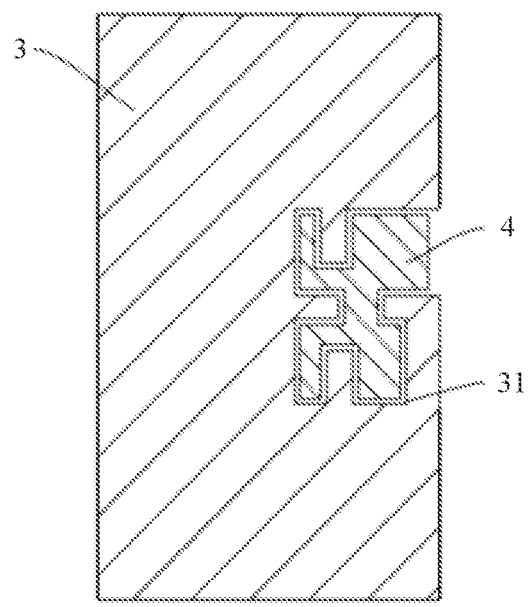
FIG. 14a and FIG. 14b are schematic diagrams of an assembly state of an adhesive component and a waterproof component in a housing structure of a terminal according to a tenth embodiment of this application.
Figure 14B:
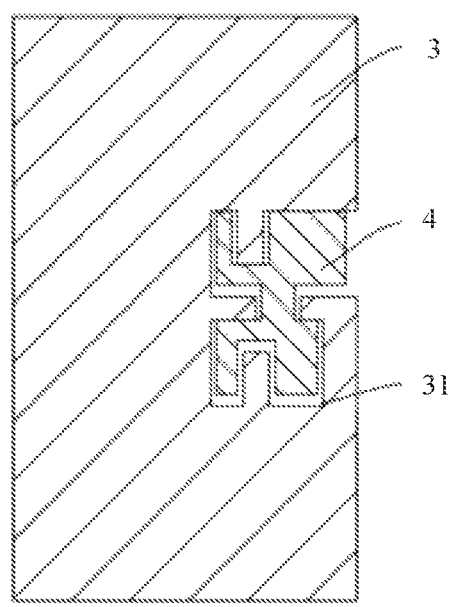

FIG. 14a and FIG. 14b are schematic diagrams of an assembly state of an adhesive component 3 and a waterproof component 4 according to the tenth embodiment of this application. It should be noted that in FIG. 14a and FIG. 14b, only the adhesive component 3 and the waterproof component 4 are shown, and another component is omitted. In the embodiment shown in FIG. 14a and FIG. 14b, there is a concave structure on each of a first side and a second side of a cross section of the waterproof component 4. In addition, there is also a concave structure on each of a third side and a fourth side of the cross section of the waterproof component 4. The fourth side shown in FIG. 14a and FIG. 14b is on a same side as an opening groove 31. FIG. 14a is a schematic diagram of a state in which the waterproof component 4 and the adhesive component 3 are normally mounted. As shown in FIG. 14a, after liquid enters a waterproof structure from the outside, if the liquid flows into a liquid inlet path on the fourth side from a liquid inlet path on the first side or the second side, the concave structure on the fourth side can further decrease a liquid inlet speed, and store the liquid. Therefore, liquid flowing out from the first side or the second side is restricted, to some extent, from flowing into a terminal. Therefore, when the waterproof component 4 is in the state of being normally mounted, in comparison with the waterproof structure in the ninth embodiment, there is a better effect in restricting, by using the waterproof structure in the tenth embodiment, the liquid from entering the terminal.

FIG. 14b is a schematic diagram of a state in which the waterproof component 4 is deviated upward during attachment. As shown in FIG. 14b, after liquid enters a waterproof structure from the outside, the liquid cannot flow into a terminal from a liquid inlet path on each of the first side and the second side because when a side wall of the concave structure on the third side is in contact with a side wall of the opening groove 31, a side wall of the concave structure on the fourth side is also in contact with the side wall of the opening groove 31. Similarly, if the waterproof component 4 in the tenth embodiment is deviated downward during attachment, the liquid may also be completely restricted from flowing into the terminal. In the waterproof structure in each of the second embodiment to the ninth embodiment, the liquid can be completely restricted from flowing into the terminal only when the waterproof component 4 is deviated to the left or to the right during attachment. However, in the waterproof structure in the tenth embodiment, the liquid can be completely restricted from flowing into the terminal when the waterproof component 4 is deviated to the left or to the right during attachment, and the liquid can be completely restricted from flowing into the terminal when the waterproof component 4 is deviated upward or downward during attachment.

In an actual process of mounting the waterproof component 4, the waterproof component 4 is likely to be deviated during attachment because of a relatively small size of the component. In the tenth embodiment, regardless of whether the waterproof component 4 is in any one of the mounting state of being deviated upward during attachment, the mounting state of being deviated downward during attachment, the mounting state of being deviated to the left during attachment, and the mounting state of being deviated to the right during attachment, the liquid can be completely restricted from flowing into the terminal. Therefore, in the tenth embodiment, there is a higher probability of completely restricting the liquid from flowing into the terminal. In general, a waterproof effect of the terminal in the tenth embodiment is better than that of the terminal in each of the first embodiment to the ninth embodiment.

It should be noted that the waterproof component 4 is made of a compressible waterproof material, for example, may be made of foam. In this way, the waterproof effect is ensured, and shock absorption can be performed for a part in which an electronic component is in contact with a housing of the terminal, to prevent the electronic component from being crushed. In the first embodiment to the tenth embodiment of this application, there is the convex structure and the concave structure on at least one of the first side and the second side of the cross section of the waterproof component 4, and a cross-sectional area of the waterproof component 4 is less than a cross-sectional area that exists when there is no convex structure or concave structure on each of the first side and the second side of the cross-section of the waterproof component 4. After a middle frame 2 and a battery cover 1 are assembled, a smaller area of the waterproof component 4 indicates smaller push force generated for the battery cover 1, to reduce a risk that the battery cover 1 comes unglued. In addition, it should be further noted that in the embodiments of this application, for the waterproof component 4 that includes no convex structure or concave structure on each of the first side and the second side of the cross section, only the rectangle shown in FIG. 1 and the trapezoid shown in FIG. 2 are shown as examples. Herein, when there is no convex structure or concave structure on each of the first side and the second side of the cross section, the waterproof component 4 may be in a shape such as a parallelogram, a triangle, or a circle.

A person skilled in the art easily figures out another implementation solution of this application after considering the specification and practicing this application disclosed herein. This application is intended to cover any variations, uses, or adaptive changes of this application. These variations, uses, or adaptive changes follow general principles of this application, and include common knowledge or a commonly used technical means in the art that is not disclosed in this application. The specification and the embodiments are merely considered as examples, and the actual scope and spirit of this application are indicated by the claims. It should be understood that this application is not limited to the precise structures that are described above and that are shown in the accompanying drawings, and various modifications and changes may be made without departing from the scope of this application. The scope of this application is limited only by the appended claims.

What is claimed is:

1. A housing structure of a terminal, wherein the housing structure comprises a battery cover, a middle frame, an adhesive component, and a waterproof component;
   the battery cover is bonded to the middle frame by using the adhesive component;
   a support wall protruding in a direction of the battery cover is disposed on the middle frame;
   the adhesive component is provided with an opening groove, and the opening groove is a semi-closed groove;
   the waterproof component is disposed between the support wall and the adhesive component, and is located in the opening groove;
   a cross-sectional shape of the waterproof component is adapted to a cross-sectional shape of the opening groove; and
   a cross section of the waterproof component is of a concave structure on each of a first side and a second side, and wherein the concave structure extends a liquid inlet path, and the first side and the second side are not on a same side as an opening of the opening groove, and are not opposite to the opening of the opening groove, and when a side wall of concave structure on the first side is in contact with a corresponding side wall of the opening groove, a side wall of concave structure on the second side is in contact with the corresponding side wall of the opening groove.

2. The housing structure according to claim 1, wherein the cross section of the waterproof component is of the concave structure on at least one of a third side and a fourth side, the third side is on a same side as the opening of the opening groove, and the fourth side is opposite to the opening of the opening groove.

3. The housing structure according to claim 2, wherein the cross section of the waterproof component is of the concave structure on each of the third side and the fourth side.

4. The housing structure according to claim 3, wherein when a side wall of concave structure on the third side is in contact with a corresponding side wall of the opening groove, a side wall concave structure on the fourth side is in contact with the corresponding side wall of the opening groove.

5. The housing structure according to claim 1, wherein when a central axis of the waterproof component is not parallel to a central axis of the opening groove, and a vertex of concave structure on the first side is in contact with a corresponding side wall of the opening groove, a vertex of concave structure on the second side is in contact with the corresponding side wall of the opening groove.

6. The housing structure according to claim 1, wherein the cross section of the waterproof component is H-shaped or cross-shaped.

7. The housing structure according to claim 1, wherein the waterproof component is made of a compressible waterproof material.

8. A housing structure of a terminal, wherein the housing structure comprises a battery cover, a middle frame, an adhesive component, and a waterproof component;
   the battery cover is bonded to the middle frame by using the adhesive component;
   a support wall protruding in a direction of the battery cover is disposed on the middle frame;
   the adhesive component is provided with an opening groove, and the opening groove is a semi-closed groove;
   the waterproof component is disposed between the support wall and the adhesive component, and is located in the opening groove;
   a cross-sectional shape of the waterproof component is adapted to a cross-sectional shape of the opening groove; and
   a cross section of the waterproof component is of a concave structure on each of a first side and a second side, and wherein the concave structure extends a liquid inlet path, and the first side and the second side are not on a same side as an opening of the opening groove, and are not opposite to the opening of the opening groove, and wherein the cross section of the waterproof component is of the concave structure on at least one of a third side and a fourth side, the third side is on a same side as the opening of the opening groove, and the fourth side is opposite to the opening of the opening groove.

9. The housing structure according to claim 8, wherein when a side wall of concave structure on the first side is in contact with a corresponding side wall of the opening groove, a side wall of concave structure on the second side is in contact with the corresponding side wall of the opening groove.

10. The housing structure according to claim 8, wherein the cross section of the waterproof component is of the concave structure on each of the third side and the fourth side.

11. The housing structure according to claim 10, wherein when a side wall of concave structure on the third side is in contact with a corresponding side wall of the opening groove, a side wall concave structure on the fourth side is in contact with the corresponding side wall of the opening groove.

12. The housing structure according to claim 8, wherein the cross section of the waterproof component is H-shaped or cross-shaped.

13. The housing structure according to claim 8, wherein the waterproof component is made of a compressible waterproof material.

14. A housing structure of a terminal, wherein the housing structure comprises a battery cover, a middle frame, an adhesive component, and a waterproof component;
   the battery cover is bonded to the middle frame by using the adhesive component;
   a support wall protruding in a direction of the battery cover is disposed on the middle frame;
   the adhesive component is provided with an opening groove, and the opening groove is a semi-closed groove;

the waterproof component is disposed between the support wall and the adhesive component, and is located in the opening groove;

a cross-sectional shape of the waterproof component is adapted to a cross-sectional shape of the opening groove; and a cross section of the waterproof component is of a concave structure on each of a first side and a second side, and wherein the concave structure extends a liquid inlet path, and the first side and the second side are not on a same side as an opening of the opening groove, and are not opposite to the opening of the opening groove, and wherein when a central axis of the waterproof component is not parallel to a central axis of the opening groove, and a vertex of concave structure on the first side is in contact with a corresponding side wall of the opening groove, a vertex of concave structure on the second side is in contact with the corresponding side wall of the opening groove.

15. The housing structure according to claim 14, wherein the cross section of the waterproof component is H-shaped or cross-shaped.

16. The housing structure according to claim 14, wherein the waterproof component is made of a compressible waterproof material.

17. The housing structure according to claim 14, wherein when a side wall of concave structure on the first side is in contact with a corresponding side wall of the opening groove, a side wall of concave structure on the second side is in contact with the corresponding side wall of the opening groove.

18. The housing structure according to claim 17, wherein the cross section of the waterproof component is of the concave structure on at least one of a third side and a fourth side, the third side is on a same side as the opening of the opening groove, and the fourth side is opposite to the opening of the opening groove.

19. The housing structure according to claim 18, wherein the cross section of the waterproof component is of the concave structure on each of the third side and the fourth side.

20. The housing structure according to claim 19, wherein when a side wall of concave structure on the third side is in contact with a corresponding side wall of the opening groove, a side wall concave structure on the fourth side is in contact with the corresponding side wall of the opening groove.

* * * * *

UNITED STATES PATENT AND TRADEMARK OFFICE
CERTIFICATE OF CORRECTION

| | |
|---|---|
| PATENT NO. | : 12,477,671 B2 |
| APPLICATION NO. | : 18/043540 |
| DATED | : November 18, 2025 |
| INVENTOR(S) | : Wenxing Yao et al. |

It is certified that error appears in the above-identified patent and that said Letters Patent is hereby corrected as shown below:

On the Title Page

In Column 1 item (71) (Applicant), In Line 2, Delete "Guangdong (CN)" and insert -- Shenzhen (CN) --.

Signed and Sealed this
Sixth Day of January, 2026

John A. Squires
*Director of the United States Patent and Trademark Office*